US011079678B2

(12) United States Patent
Jang et al.

(10) Patent No.: US 11,079,678 B2
(45) Date of Patent: *Aug. 3, 2021

(54) PHOTOPOLYMER COMPOSITION

(71) Applicant: LG CHEM, LTD., Seoul (KR)

(72) Inventors: Seok Hoon Jang, Daejeon (KR); Heon Kim, Daejeon (KR); Yongjoon Heo, Daejeon (KR); Se Hyun Kwon, Daejeon (KR); Yeong Rae Chang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 193 days.

This patent is subject to a terminal disclaimer.

(21) Appl. No.: 16/343,153

(22) PCT Filed: Sep. 11, 2018

(86) PCT No.: PCT/KR2018/010635
§ 371 (c)(1),
(2) Date: Apr. 18, 2019

(87) PCT Pub. No.: WO2019/066313
PCT Pub. Date: Apr. 4, 2019

(65) Prior Publication Data
US 2019/0317404 A1 Oct. 17, 2019

(30) Foreign Application Priority Data

Sep. 27, 2017 (KR) .......................... 10-2017-0125446
Sep. 10, 2018 (KR) .......................... 10-2018-0107996

(51) Int. Cl.
| | | |
|---|---|---|
| *G03H 1/02* | (2006.01) | |
| *G03F 7/004* | (2006.01) | |
| *G03F 7/033* | (2006.01) | |
| *C08K 5/541* | (2006.01) | |
| *C08F 2/50* | (2006.01) | |
| *C08L 33/06* | (2006.01) | |
| *C08L 43/04* | (2006.01) | |
| *G03F 7/075* | (2006.01) | |
| *G03F 7/00* | (2006.01) | |

(52) U.S. Cl.
CPC ............. *G03F 7/0758* (2013.01); *C08F 2/50* (2013.01); *C08K 5/541* (2013.01); *C08L 33/06* (2013.01); *C08L 43/04* (2013.01); *G03F 7/001* (2013.01); *G03F 7/0046* (2013.01); *G03F 7/033* (2013.01); *G03H 1/02* (2013.01); *G03H 2001/0216* (2013.01); *G03H 2001/0264* (2013.01)

(58) Field of Classification Search
CPC . G03F 7/075; G03F 7/00; G03F 7/004; G03F 7/033; C08K 5/541; C08K 5/54; C08K 5/00; C08K 5/02; C08L 71/12; C08L 33/06; C08L 33/00; C08L 33/08; C08L 43/04

See application file for complete search history.

(56) References Cited

U.S. PATENT DOCUMENTS

| | | | |
|---|---|---|---|
| 4,963,471 A | * | 10/1990 | Trout .................... G03F 7/001 |
| | | | 430/282.1 |
| 5,196,487 A | | 3/1993 | Kogure et al. |
| 6,368,771 B1 | | 4/2002 | Koh et al. |
| 7,611,826 B2 | | 11/2009 | Yang et al. |
| 2003/0096904 A1 | | 5/2003 | Hakuta et al. |
| 2005/0101698 A1 | | 5/2005 | Harada et al. |
| 2007/0015893 A1 | | 1/2007 | Hakuta et al. |
| 2010/0092686 A1 | | 4/2010 | Laryea et al. |
| 2012/0164565 A1 | | 6/2012 | Qiu |
| 2012/0171433 A1 | | 7/2012 | Qiu |
| 2012/0178019 A1 | | 7/2012 | Jain et al. |
| 2020/0150528 A1 | * | 5/2020 | Jang ..................... C08L 75/04 |
| 2020/0192218 A1 | * | 6/2020 | Jang ..................... G03F 7/0757 |
| 2020/0263038 A1 | * | 8/2020 | Kim ..................... G03F 7/0755 |
| 2020/0355996 A1 | * | 11/2020 | Kim ..................... G11B 7/24 |

FOREIGN PATENT DOCUMENTS

| | | | |
|---|---|---|---|
| CN | 101679598 A | | 3/2010 |
| CN | 101985531 | * | 3/2011 |
| CN | 103130966 A | | 6/2013 |
| JP | H07-333849 A | | 12/1995 |
| JP | 09-106241 | * | 4/1997 |
| JP | 2981567 B2 | | 11/1999 |

(Continued)

OTHER PUBLICATIONS

Machine translation of JP 09-106241 (1997 ).*
Machine translation of JP 2014-026116 (2014).*
Machine translation of CN 101985531 (2011 ).*
Machine translation of JP 2001-240805 (2001).*
European Search Report issued for European Application No. 18860372.4 dated Oct. 31, 2019, 7 pages.

(Continued)

*Primary Examiner* — Martin J Angebranndt
(74) *Attorney, Agent, or Firm* — Rothwell, Figg, Ernst & Manbeck, P.C.

(57) ABSTRACT

A photopolymer composition comprising a polymer matrix or a precursor thereof including a reaction product between (i) a (meth)acrylate-based (co)polymer in which a silane-based functional group is located in a branched chain and an equivalent weight of the silane-based functional group is 300 g/eq to 2000 g/eq, and (ii) a linear silane crosslinking agent; a photoreactive monomer; and a photoinitiator, a hologram recording medium using the same, an optical element using the hologram recording medium, and a holographic recording method. The photopolymer composition can more easily provide a photopolymer layer having improved durability against temperature and humidity while having a large refractive index modulation value.

18 Claims, No Drawings

(56) References Cited

FOREIGN PATENT DOCUMENTS

| | | |
|---|---|---|
| JP | 2001-240805 A | 9/2001 |
| JP | 2002-236440 A | 8/2002 |
| JP | 2009-205137 A | 9/2009 |
| JP | 2010-122462 A | 6/2010 |
| JP | 4740894 B2 | 8/2011 |
| JP | 2014-026116 * | 2/2014 |
| JP | 2014-026116 A | 2/2014 |
| JP | 5488146 B2 | 5/2014 |
| KR | 10-2001-0011768 A | 2/2001 |
| KR | 10-2002-0033195 A | 5/2002 |
| KR | 10-2004-0031137 A | 4/2004 |
| KR | 10-2005-0027567 A | 3/2005 |
| KR | 10-0680264 B1 | 2/2007 |
| TW | 201124484 A1 | 7/2011 |
| TW | 201245913 A1 | 11/2012 |
| WO | 2011-034847 A1 | 3/2011 |
| WO | 2013-034847 A1 | 3/2013 |

OTHER PUBLICATIONS

International Search Report and Written Opinion issued for International Application No. PCT/KR2018/010635 dated Jan. 9, 2019, 9 pages.

* cited by examiner

PHOTOPOLYMER COMPOSITION

CROSS-REFERENCE TO RELATED APPLICATION(S)

This application is a 35 U.S.C. § 371 National Phase Entry application from PCT/KR2018/010635, filed on Sep. 11, 2018, and designating the United States, which claims priority to and the benefits of Korean Patent Application No. 10-2017-0125446 filed on Sep. 27, 2017 and Korean Patent Application No. 10-2018-0107996 filed on Sep. 10, 2018 with the Korean Intellectual Property Office, the disclosures of which are incorporated herein by reference in their entirety.

The present invention relates to a photopolymer composition, a hologram recording medium, an optical element, and a holographic recording method.

BACKGROUND ART

Technical Field

A hologram recording medium records information by changing a refractive index in a holographic recording layer in the medium through an exposure process, reads variation of the refractive index in the medium thus recorded, and reproduces the information.

When a photopolymer (photosensitive resin) is used, a light interference pattern can be easily stored as a hologram by photopolymerization of a low molecular weight monomer. Therefore, the photopolymer can be used in various fields such as optical lenses, mirrors, deflecting mirrors, filters, diffusing screens, diffraction elements, light guides, waveguides, holographic optical elements having projection screen and/or mask functions, media of optical memory systems and light diffusion plates, optical wavelength multiplexers, reflection-type and transmission-type color filters, and the like.

Typically, a photopolymer composition for hologram production includes a polymer binder, a monomer, and a photoinitiator, and the photosensitive film produced from such a composition is irradiated with laser interference light to induce photopolymerization of local monomers.

In a portion where a relatively large number of monomers are present in such photopolymerization process, the refractive index becomes high, and in a portion where a relatively large number of polymer binders are present, the refractive index is relatively lowered and thus the refractive index modulation occurs, and a diffraction grating is generated by such refractive index modulation. The value n of refractive index modulation is influenced by the thickness and the diffraction efficiency (DE) of the photopolymer layer, and the angular selectivity increases as the thickness decreases.

Recently, development of materials capable of maintaining a stable hologram with high diffraction efficiency has been demanded, and also various attempts have been made to manufacture a photopolymer layer having a thin thickness and a large value of refractive index modulation.

DETAILED DESCRIPTION OF THE INVENTION

Technical Problem

It is an object of the present invention to provide a photopolymer composition which can more easily provide a photopolymer layer having improved durability against temperature and humidity while having a large refractive index modulation value.

It is another object of the present invention to provide a hologram recording medium including a photopolymer layer having improved durability against temperature and humidity while having a large refractive index modulation value.

It is still another object of the present invention to provide an optical element including the above-described hologram recording medium.

It is a further object of the present invention to provide a holographic recording method including selectively polymerizing photoreactive monomers contained in the photopolymer composition by a coherent laser.

Technical Solution

One embodiment of the present invention provides a photopolymer composition including: a polymer matrix or a precursor thereof including a reaction product between (i) a (meth)acrylate-based (co)polymer in which a silane-based functional group is located in a branched chain and an equivalent weight of the silane-based functional group is 300 g/eq to 2000 g/eq and (ii) a linear silane crosslinking agent; a photoreactive monomer; and a photoinitiator.

Another embodiment of the present invention provides a hologram recording medium produced from the above-described photopolymer composition.

Still another embodiment of the present invention provides an optical element including the above-described hologram recording medium.

A further embodiment of the present invention provides a holographic recording method including selectively polymerizing photoreactive monomers contained in the photopolymer composition by a coherent laser.

Hereinafter, a photopolymer composition, a hologram recording medium, an optical element, and a holographic recording method according to a specific embodiment of the present invention will be described in more detail.

As used herein, the term "(meth)acrylate" refers to either methacrylate or acrylate.

As used herein, the term "(co)polymer" refers to either a homopolymer or a copolymer (including a random copolymer, a block copolymer, and a graft copolymer).

As used herein, the term "hologram" or "hologram recording medium" refers to a recording medium in which optical information is recorded in an entire visible range and a near ultraviolet range (300 to 800 nm) through an exposure process, and examples thereof include all of visual holograms such as in-line (Gabor) holograms, off-axis holograms, full-aperture transfer holograms, white light transmission holograms ("rainbow holograms"), Denisyuk holograms, off-axis reflection holograms, edge-lit holograms or holographic stereograms.

In the present specification, the alkyl group may be a straight chain or a branched chain alkyl, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 2-methylpentyl, 4-methylhexyl, 5-methylhexyl, and the like, but are not limited thereto.

In the present specification, the alkylene group is a bivalent functional group derived from alkane, and may be, for example, a linear, branched, or cyclic methylene group, an ethylene group, a propylene group, an isobutylene group, a sec-butylene group, a tert-butylene group, a pentylene group, a hexylene group, and the like.

According to one embodiment of the present invention, there may be provided a photopolymer composition including: a polymer matrix or a precursor thereof including a reaction product between (i) a (meth)acrylate-based (co)polymer in which a silane-based functional group is located in a branched chain and an equivalent weight of the silane-based functional group is 300 g/eq to 2000 g/eq, and (ii) a linear silane crosslinking agent; a photoreactive monomer; and a photoinitiator.

The present inventors found through experiments that holograms produced from the photopolymer composition including a polymeric matrix or a precursor thereof using a (meth)acrylate-based (co)polymer in which the silane-based functional group is located in a branched chain and the equivalent weight of the silane-based functional group is 300 g/eq to 2000 g/eq, can achieve significantly improved refractive index modulation values and superior durability against temperature and humidity even in thinner thickness ranges as compared with holograms previously known in the art, thereby completing the present invention.

More specifically, in the (meth)acrylate-based (co)polymer, as the equivalent weight of the silane-based functional group is adjusted to 300 g/eq to 2000 g/eq while the silane-based functional group is positioned in a branched chain, the crosslinking density with the linear silane crosslinking agent is optimized and thus superior durability against temperature and humidity can be ensured as compared with conventional matrices. In addition, through the optimization of the crosslinking density as described above, the mobility between a photoreactive monomer having a high refractive index and a component having a low refractive index can be increased, thereby maximizing the refractive index modulation and improving the recording characteristics.

In particular, a crosslinked structure mediating a siloxane bond can be easily introduced through a sol-gel reaction between a modified (meth)acrylate-based (co)polymer containing a silane-based functional group and a linear silane crosslinking agent containing a terminal silane-based functional group, and excellent durability against temperature and humidity can be ensured through such siloxane bond.

Further, in the present invention, as a component of the polymer matrix or its precursor, a fluorine-based compound, a phosphate-based compound, or the like can be further included. Since the fluorine-based compound or the phosphate-based compound can have a lower refractive index than the photoreactive monomer, it is possible to lower the refractive index of the polymer matrix and thus maximize the refractive index modulation of the photopolymer composition.

In addition, the phosphate-based compound acts as a plasticizer to lower the glass transition temperature of the polymer matrix and increase the mobility of photoreactive monomers and low refractive index components, which also contributes to improving the formability of the photopolymer composition.

Hereinafter, each component of the photopolymer composition of one embodiment will be described in more detail.

(1) Polymer Matrix or Precursor Thereof

The polymer matrix may serve as a support for the final product such as the photopolymer composition and a film produced therefrom. In the hologram formed from the photopolymer composition, it may serve as a portion having a different refractive index to enhance the refractive index modulation.

As described above, the polymer matrix may include a reaction product between (i) a (meth)acrylate-based (co)polymer in which a silane-based functional group is located in a branched chain and an equivalent weight of the silane-based functional group is 300 g/eq to 2000 g/eq, and (ii) a linear silane crosslinking agent. Thus, the precursor of the polymer matrix includes a monomer or an oligomer forming the polymer matrix. Specifically, it may include a (meth)acrylate-based (co)polymer in which the silane-based functional group is located in the branched chain and the equivalent weight of the silane-based functional group is 300 g/eq to 2000 g/eq, or a monomer thereof or an oligomer of the monomer, and a linear silane crosslinking agent, or a monomer thereof or an oligomer of the monomer.

In the (meth)acrylate-based (co)polymer, the silane-based functional group may be located in a branched chain. The silane-based functional group may include a silane functional group or an alkoxysilane functional group. Preferably, a trimethoxysilane group can be used as the alkoxysilane functional group.

The silane-based functional group may form siloxane bonds through a sol-gel reaction with the silane-based functional group contained in the linear silane crosslinking agent to crosslink the (meth)acrylate-based (co)polymer and the linear silane crosslinking agent.

In this case, in the (meth)acrylate-based (co)polymer, the equivalent weight of the silane-based functional group may be 300 g/eq to 2000 g/eq, 500 g/eq to 2000 g/eq, 550 g/eq to 1800 g/eq, 580 g/eq to 1600 g/eq, or 586 g/eq to 1562 g/eq. The equivalent weight of the silane-based functional group is an equivalent weight (g/eq) for one silane-based functional group, which is a value obtained by dividing the weight average molecular weight of the (meth)acrylate-based (co)polymer by the number of silane-based functional groups per molecule. The smaller the silane-based functional group equivalent weight, the higher the functional group density. The higher the equivalent weight, the smaller the functional group density.

Therefore, the crosslinking density between the (meth)acrylate-based (co)polymer and the linear silane crosslinking agent can be optimized, thereby ensuring superior durability against temperature and humidity as compared with conventional matrices. In addition, through the optimization of the crosslinking density as described above, the mobility between a photoreactive monomer having a high refractive index and a component having a low refractive index can be increased, thereby maximizing the refractive index modulation and improving the recording characteristics.

When the equivalent weight of the silane-based functional group contained in the (meth)acrylate-based (co)polymer is excessively decreased below 300 g/eq, the crosslinking density of the matrix becomes too high and the mobility of the components is inhibited, thereby causing a decrease in the recording characteristics. Further, when the equivalent weight of the silane-based functional group contained in the (meth)acrylate-based (co)polymer is excessively increased beyond 2000 g/eq, the crosslinking density is too low to serve as a support, and the diffraction grating interface formed after recording is collapsed, so that the refractive index modulation value can be reduced with the passage of time.

More specifically, the (meth)acrylate-based (co)polymer may include a (meth)acrylate repeating unit in which the silane-based functional group is located in a branched chain, and a (meth)acrylate repeating unit.

An example of the (meth)acrylate repeating unit in which the silane-based functional group is located in a branched chain may include a repeating unit represented by the following Chemical Formula 1.

[Chemical Formula 1]

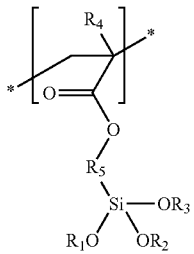

In Chemical Formula 1, $R_1$ to $R_3$ are each independently an alkyl group having 1 to 10 carbon atoms, $R_4$ is hydrogen or an alkyl group having 1 to 10 carbon atoms, and $R_5$ is an alkylene group having 1 to 10 carbon atoms.

Preferably, in Chemical Formula 1, $R_1$ to $R_3$ are each independently a methyl group, $R_4$ is a methyl group, and $R_5$ is a propylene group, which may be a repeating unit derived from methacryloxypropyltrimethoxysilane (KBM-503), or $R_1$ to $R_3$ are each independently a methyl group having one carbon atom, $R_4$ is hydrogen, and $R_5$ is a propylene group having 3 carbon atoms, which may be a repeating unit derived from 3-acryloxypropyltrimethoxysilane (KBM-5103).

Further, an example of the (meth)acrylate repeating unit may include a repeating unit represented by the following Chemical Formula 2.

[Chemical Formula 2]

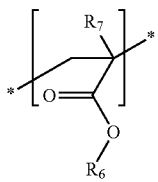

In Chemical Formula 2, $R_6$ is an alkyl group having 1 to 20 carbon atoms, and $R_7$ is hydrogen or an alkyl group having 1 to 10 carbon atoms. Preferably, in Chemical Formula 2, $R_6$ is a butyl group and $R_7$ is hydrogen, which may be a repeating unit derived from butyl acrylate.

The molar ratio between the repeating unit of Chemical Formula 2 and the repeating unit of Chemical Formula 1 may be 0.5:1 to 14:1. When the molar ratio of the repeating unit of Chemical Formula 1 excessively decreases, the crosslinking density of the matrix becomes too low to serve as a support, resulting in a decrease in recording characteristics after recording. When the molar ratio of the repeating unit of Chemical Formula 1 is excessively increased, the crosslinking density of the matrix becomes too high and the mobility of the respective components decreases, resulting in a decrease in the refractive index modulation value.

The weight average molecular weight (measured by GPC) of the (meth)acrylate-based (co)polymer may be 100,000 g/mol to 5,000,000 g/mol, or 300,000 g/mol to 900,000 g/mol. As used herein, the weight average molecular weight means a weight average molecular weight in terms of polystyrene measured by the GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. In specific examples of the measurement conditions, a Waters PL-GPC220 instrument was used with a PLgel MIX-B column (length of 300 mm) from Polymer Laboratories, the evaluation temperature was 160° C., 1,2,4-trichlorobenzene was used as a solvent, and the flow rate was 1 mL/min. The sample was prepared at a concentration of 10 mg/10 mL, and then supplied in an amount of 200 μL. The value of Mw can be determined using the calibration curve generated with polystyrene standards. Nine types of the polystyrene standards with respective molecular weights of 2000, 10,000, 30,000, 70,000, 200,000, 700,000, 2,000,000, 4,000,000, and 10,000,000 were used.

Meanwhile, the linear silane crosslinking agent may be a compound having an average of at least one silane-based functional group per molecule or a mixture thereof, and it may be a compound containing at least one silane-based functional group. The silane-based functional group may include a silane functional group or an alkoxysilane functional group. Preferably, a triethoxysilane group can be used as the alkoxysilane functional group. The silane-based functional group can form siloxane bonds through a sol-gel reaction with the silane-based functional group contained in the (meth)acrylate-based (co)polymer, thereby crosslinking the (meth)acrylate-based (co)polymer and the linear silane crosslinking agent.

In this case, the linear silane crosslinking agent may have a silane-based functional group equivalent weight of 200 g/eq to 1000 g/eq, 300 g/eq to 900 g/eq, 400 g/eq to 800 g/eq, 440 e/eq to 750 g/eq, or 447 g/eq to 747 g/eq. As a result, the crosslinking density between the (meth)acrylate-based (co)polymer and the linear silane crosslinking agent can be optimized, thereby ensuring superior durability against temperature and humidity as compared with conventional matrices. In addition, through the optimization of the crosslinking density as described above, the mobility between a photoreactive monomer having a high refractive index and a component having a low refractive index can be increased, thereby maximizing the refractive index modulation and improving the recording characteristics.

When the equivalent weight of the silane-based functional group contained in the linear silane crosslinking agent is excessively increased to 1000 g/eq or more, the diffraction grating interface after recording may be collapsed due to the decrease of the crosslinking density of the matrix. In addition, due to the loose crosslinking density and the low glass transition temperature, the monomer and plasticizer components can be eluted on the surface to cause haze. When the equivalent weight of the silane-based functional group contained in the linear silane crosslinking agent is excessively reduced to less than 200 g/eq, the crosslinking density becomes too high and the mobility of the monomer and the plasticizer component is inhibited, thereby causing a problem that the recording characteristics are remarkably lowered.

Meanwhile, the ratio between the equivalent weight of the silane-based functional groups located in the branched chain of the (meth)acrylate-based (co)polymer and the equivalent weight of the silane-based functional groups contained in the linear silane crosslinking agent is from 22:1 to 0.5:1, from 20:1 to 0.5:1, from 15:1 to 0.5:1, from 10:1 to 0.5:1, from 5:1 to 0.6:1, from 4:1 to 0.7:1, or from 3.5:1 to 0.78:1. Therefore, the crosslinking density between the (meth)acrylate-based (co)polymer and the linear silane crosslinking agent can be optimized, thereby ensuring superior durability against temperature and humidity as compared with conventional matrices. In addition, through the optimization of the crosslinking density as described above, the mobility between a photoreactive monomer having a high refractive index and a component having a low refractive index can be increased, thereby maximizing the refractive index modulation and improving the recording characteristics.

More specifically, the linear silane crosslinking agent may include a linear polyether main chain having a weight average molecular weight of 100 g/mol to 2000 g/mol, 300 g/mol to 1000 g/mol, or 300 g/mol to 700 g/mol, and a silane-based functional group bonded to the terminal or branched chain of the main chain.

The linear polyether main chain having a weight average molecular weight of 100 g/mol to 2000 g/mol may include a repeating unit represented by the following Chemical Formula 3.

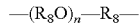   [Chemical Formula 3]

In Chemical Formula 3, $R_8$ is an alkylene group having 1 to 10 carbon atoms, and n is an integer of 1 or more, 1 to 50, 5 to 20, or 8 to 10.

As the linear silane crosslinking agent introduces a flexible polyether polyol into a main chain, the mobility of the components can be improved through adjustment of the glass transition temperature and crosslinking density of the matrix.

Meanwhile, a bond between the silane-based functional group and the polyether main chain may be mediated by a urethane bond. Specifically, the silane-based functional group and the polyether main chain may form between them a urethane bond. More specifically, the silicon atom contained in the silane-based functional group binds directly to the nitrogen atom of the urethane bond or via an alkylene group having 1 to 10 carbon atoms. The functional group $R_8$ contained in the polyether main chain can be directly bonded to the oxygen atom of the urethane bond.

The reason why the silane-based functional group and the polyether main chain are bonded via a urethane bond in this way is that the linear silane crosslinking agent is a reaction product produced through the reaction between an isocyanate compound containing a silane-based functional group and a linear polyether polyol compound having a weight average molecular weight of 100 g/mol to 2000 g/mol.

More specifically, the isocyanate compound may include an aliphatic, cycloaliphatic, aromatic, or aromatic-aliphatic mono-isocyanate, di-isocyanate, tri-isocyanate, or poly-isocyanate; or an oligo-isocyanate or poly-isocyanate of diisocyanate or triisocyanate having urethane, urea, carbodiimide, acylurea, isocyanurate, allophanate, biuret, oxadiazinetrione, uretdione, or iminooxadiazinedione structures.

Specific examples of the isocyanate compound containing the silane-based functional group include 3-isocyanatopropyltriethoxysilane (KBE-9007).

Further, the polyether polyol may be, for example, multiple addition products of styrene oxide, ethylene oxide, propylene oxide, tetrahydrofuran, butylene oxide, or epichlorohydrin, and their mixed addition products and graft products, polyether polyols and polyhydric alcohols obtained by condensation of polyhydric alcohols or mixtures thereof, and those obtained by alkoxylation of amines and amino alcohols.

Specific examples of the polyether polyol include poly(propylene oxide), poly(ethylene oxide), and combinations thereof, or poly(tetrahydrofuran) and mixtures thereof, which are in the form of random or block copolymers having OH functionality of 1.5 to 6 and a number average molecular weight between 200 g/mol and 18,000 g/mol, preferably OH functionality of 1.8 to 4.0 and a number average molecular weight between 600 g/mol and 8000 g/mol, and particularly preferably an OH functionality of 1.9 to 3.1 and a number average molecular weight between 650 g/mol and 4500 g/mol.

In this way, when the silane-based functional group and the polyether main chain are bonded via a urethane bond, a linear silane crosslinking agent can be more easily synthesized.

The linear silane crosslinking agent has a weight average molecular weight (measured by GPC) of 500 g/mol to 5,000,000 g/mol, 600 g/mol to 10,000 g/mol, 700 g/mol to 5000 g/mol, 800 g/mol to 2000 g/mol, or 900 g/mol to 1500 g/mol. As used herein, the weight average molecular weight means a weight average molecular weight in terms of polystyrene determined by the GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. In specific examples of the measurement conditions, a Waters PL-GPC220 instrument was used with a PLgel MIX-B column (length of 300 mm) from Polymer Laboratories, the evaluation temperature was 160° C., 1,2,4-trichlorobenzene was used as a solvent, and the flow rate was 1 mL/min. The sample was prepared at a concentration of 10 mg/10 mL, and then supplied in an amount of 200 μL. The value of Mw can be determined using the calibration curve generated with polystyrene standards. Nine types of the polystyrene standards with respective molecular weights of 2000, 10,000, 30,000, 70,000, 200,000, 700,000, 2,000,000, 4,000,000, and 10,000,000 were used.

Meanwhile, in the reaction product between (i) a (meth)acrylate-based (co)polymer in which a silane-based functional group is located in a branched chain and an equivalent weight of the silane-based functional group is 300 g/eq to 2000 g/eq and (ii) a linear silane crosslinking agent, the linear silane crosslinking agent may be contained in an amount of 10 parts by weight to 90 parts by weight, 20 parts by weight to 70 parts by weight, or 22 parts by weight to 65 parts by weight, based on 100 parts by weight of the (meth)acrylate-based (co)copolymer.

When the content of the linear silane crosslinking agent in the reaction product is excessively reduced relative to 100 parts by weight of the (meth)acrylate-based (co)polymer, the curing rate of the matrix is remarkably slow and the function as a support is lost, and the diffraction grating interface after recording can be easily collapsed. When the content of the linear silane crosslinking agent in the reaction product is excessively increased relative to 100 parts by weight of the (meth)acrylate-based (co)polymer, the curing rate of the matrix becomes faster, but compatibility issues with other components arise due to an excessive increase in the content of the reactive silane group and thus haze occurs.

In addition, the modulus (storage modulus) of the reaction product may be 0.01 MPa to 5 MPa. As a specific example of the modulus measuring method, the value of storage modulus (G) can be measured at a frequency of 1 Hertz at room temperature (20° C. to 25° C.) using DHR (Discovery Hybrid Rheometer) equipment from TA Instruments.

Further, the glass transition temperature of the reaction product may be −40° C. to 10° C. A specific example of the glass transition temperature measuring method includes a method of measuring a change in phase angle (loss modulus) of the film coated with a photopolymerizable composition in the temperature range from −80° C. to 30° C. under the setting conditions of strain of 0.1%, frequency of 1 Hz, and temperature raising rate 5° C./min by using DMA (dynamic mechanical analysis) measuring equipment.

(2) Photoreactive Monomer

Meanwhile, the photoreactive monomer may include a polyfunctional (meth)acrylate monomer or a monofunctional (meth)acrylate monomer.

As described above, in a portion where the monomer is polymerized in the process of photopolymerization of the photopolymer composition and the polymer is present in relatively large amounts, the refractive index becomes high. In a portion where the polymer binder is present in relatively large amounts, the refractive index becomes relatively low, the refractive index modulation occurs, and diffraction grating is generated by such refractive index modulation.

Specifically, one example of the photoreactive monomer may include (meth)acrylate-based α,β-unsaturated carboxylic acid derivatives, for example, (meth)acrylate, (meth)acrylamide, (meth)acrylonitrile, (meth)acrylic acid, or the like, or a compound containing a vinyl group or a thiol group.

One example of the photoreactive monomer may include a polyfunctional (meth)acrylate monomer having a refractive index of 1.5 or more, 1.53 or more, or 1.5 to 1.7. The polyfunctional (meth)acrylate monomer having a refractive index of 1.5 or more, 1.53 or more, or 1.5 to 1.7 may include a halogen atom (bromine, iodine, etc.), sulfur (S), phosphorus (P), or an aromatic ring.

More specific examples of the polyfunctional (meth) acrylate monomer having the refractive index of 1.5 or more include a bisphenol A modified diacrylate type, a fluorene acrylate type (HR6022, Miwon Specialty Chemical Co., Ltd.), a bisphenol fluorene epoxy acrylate type (HR6100, HR6060, HR6042, etc.—Miwon), a halogenated epoxy acrylate type (HR1139, HR3362, etc., Miwon).

Another example of the photoreactive monomer may include a monofunctional (meth)acrylate monomer. The monofunctional (meth)acrylate monomer may contain an ether bond and a fluorene functional group in the molecule. Specific examples of such monofunctional (meth)acrylate monomer include phenoxybenzyl (meth)acrylate, o-phenylphenol ethylene oxide (meth)acrylate, benzyl (meth) acrylate, 2-(phenylthio)ethyl (meth)acrylate, biphenylmethyl (meth)acrylate, or the like.

On the other hand, the photoreactive monomer may have a weight average molecular weight of 50 g/mol to 1000 g/mol, or 200 g/mol to 600 g/mol. The weight average molecular weight means a weight average molecular weight in terms of polystyrene measured by the GPC method.

(3) Photoinitiator

The photopolymer composition of the embodiment includes a photoinitiator. The photoinitiator is a compound which is activated by light or actinic radiation, and initiates polymerization of a compound containing a photoreactive functional group such as the photoreactive monomer.

As the photoinitiator, commonly known photoinitiators can be used without particular limitation, but specific examples thereof include a photoradical polymerization initiator, a photocationic polymerization initiator, and a photoanionic polymerization initiator.

Specific examples of the photoradical polymerization initiator include imidazole derivatives, bisimidazole derivatives, N-aryl glycine derivatives, organic azide compounds, titanocene, aluminate complexes, organic peroxides, N-alkoxypyridinium salts, thioxanthone derivatives, amine derivatives, or the like. More specifically, examples of the photoradical polymerization initiator include 3-di(t-butyldioxycarbonyl)benzophenone, 3,3',4,4"-tetrakis(t-butyldioxycarbonyl)benzophenone, 3-phenyl-5-isoxazolone, 2-mercapto benzimidazole, bis(2,4,5-triphenyl)imidazole, 2,2-dimethoxy-1,2-diphenylethane-1-one (product name: Irgacure 651, manufacturer: BASF), 1-hydroxy-cyclohexyl-phenyl-ketone (product name: Irgacure 184, manufacturer: BASF), 2-benzyl-2-dimethylamino-1-(4-morpholinophenyl)-butanone-1 (product name: Irgacure 369, manufacturer: BASF), and bis(η5-2,4-cyclopentadiene-1-yl)-bis(2,6-difluoro-3-(1H-pyrrole-1-yl)-phenyl)titanium (product name: Irgacure 784, manufacturer: BASF), Ebecryl P-115 (manufacturer: SK Entis), or the like.

The photocationic polymerization initiator may include a diazonium salt, a sulfonium salt, or an iodonium salt, and examples thereof include sulfonic acid esters, imidosulfonates, dialkyl-4-hydroxysulfonium salts, arylsulfonic acid-p-nitrobenzyl esters, silanol-aluminum complexes, (η6-benzene) (η5-cyclopentadienylnron (II), or the like. In addition, benzoin tosylate, 2,5-dinitrobenzyltosylate, N-tosylphthalic acid imide, or the like can be mentioned. More specific examples of the photocationic polymerization initiator include commercially available products such as Cyracure UVI-6970, Cyracure UVI-6974, and Cyracure UVI-6990 (manufacturer: Dow Chemical Co. in USA), Irgacure 264 and Irgacure 250 (manufacturer: BASF), or CIT-1682 (manufacturer: Nippon Soda).

The photoanionic polymerization initiator may include a borate salt, and examples thereof include butyrylcholine butyl triphenyl borate or the like. More specific examples of the photoanionic polymerization initiator include commercially available products such as Borate V (manufacturer: Spectra Group) or the like.

In addition, the photopolymer composition of the embodiment may include a monomolecular (type I) initiator or bimolecular (type II) initiator. The (type I) system for free radical photopolymerization may include, for example, an aromatic ketone compound in combination with a tertiary amine, such as benzophenone, alkylbenzophenone, 4,4'-bis (dimethylamino)benzophenone (Michler's ketone), anthrone, and halogenated benzophenone, or a mixture of these types. The bimolecular (type II) initiator may include benzoin and derivatives thereof, benzyl ketal, an acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha-dialkoxyacetophenone, 1-[4-(phenylthio)phenyl]octane-1,2-dione 2-(O-benzoyloxime), alpha-hydroxyalkylphenone, and the like.

(4) Photopolymer Composition

The photopolymer composition may include: 20% to 80% by weight of the polymer matrix or a precursor thereof; 10% to 70% by weight of the photoreactive monomer; and 0.1% to 15% by weight of the photoinitiator. When the photopolymer composition further includes an organic solvent as described below, the content of the above-mentioned components is based on the sum of the above-mentioned components (the sum of the components excluding the organic solvent).

The photopolymer composition may further include a fluorine-based compound. The fluorine-based compound has stability with little reactivity and has low refractive index characteristics. Therefore, when added to the photopolymer composition, the refractive index of the polymer matrix can be further lowered, and thus the refractive index modulation with the monomer can be maximized.

The fluorine-based compound may include at least two difluoromethylene groups, and at least one functional group selected from the group consisting of an ether group, an ester group, and an amide group. More specifically, the fluorine-based compound may have a structure of the following Chemical Formula 4 in which a functional group containing an ether group is bonded to both terminals of a central functional group containing a direct bond or an ether bond between two difluoromethylene groups.

[Chemical Formula 4]

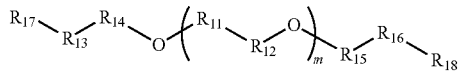

In Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently a polyalkylene oxide group, and m is an integer of 1 or more, 1 to 10, or 1 to 3.

Preferably, in Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, $R_{17}$ and $R_{18}$ are each independently a 2-methoxyethoxymethoxy group, and m is an integer of 2.

The fluorine-based compound may have a refractive index of less than 1.45, or 1.3 or more and less than 1.45. As described above, since the photoreactive monomer has a refractive index of 1.5 or more, the fluorine-based compound can further lower the refractive index of the polymer matrix through a refractive index that is lower than that of the photoreactive monomer, thereby maximizing the refractive index modulation with the monomer.

Specifically, the content of the fluorine-based compound may be 30 parts by weight to 150 parts by weight, or 50 parts by weight to 110 parts by weight, based on 100 parts by weight of the photoreactive monomer, and the refractive index of the polymer matrix may be 1.46 to 1.53.

When the content of the fluorine-based compound is excessively reduced relative to 100 parts by weight of the photoreactive monomer, the value of the refractive index modulation after recording is lowered due to the deficiency of low refractive index components. When the content of the fluorine-based compound is excessively increased relative to 100 parts by weight of the photoreactive monomer, haze occurs due to compatibility issues with other components, or some fluorine-based compounds may be eluted on the surface of the coating layer.

The fluorine-based compound may have a weight average molecular weight (measured by GPC) of 300 g/mol or more, or 300 g/mol to 1000 g/mol. A specific method of measuring the weight average molecular weight is as described above.

The photopolymer composition may further include a photosensitizing dye. The photosensitizing dye serves as photosensitizing pigment to sensitize the photoinitiator. More specifically, the photosensitizing dye may be stimulated by the light irradiated on the photopolymer composition and may also serve as an initiator to initiate polymerization of the monomer and the crosslinking monomer. The photopolymer composition may contain 0.01% to 30% by weight, or 0.05% to 20% by weight, of the photosensitizing dye.

Examples of the photosensitizing dye are not particularly limited, and various compounds commonly known in the art can be used. Specific examples of the photosensitizing dye include sulfonium derivative of ceramidonine, new methylene blue, thioerythrosine triethylammonium, 6-acetylamino-2-methylceramidonin, eosin, erythrosine, rose bengal, thionine, basic yellow, Pinacyanol chloride, Rhodamine 6G, Gallocyanine, ethyl violet, Victoria blue R, Celestine blue), Quinaldine Red, Crystal Violet, Brilliant Green, Astrazon orange G, Darrow Red), Pyronin Y), Basic Red 29, pyrylium iodide, Safranin O, Cyanine, Methylene Blue, Azure A, or a combination of two or more thereof.

The photopolymer composition may further include an organic solvent. Non-limiting examples of the organic solvent include ketones, alcohols, acetates ethers, and mixtures of two or more thereof.

Specific examples of such organic solvent include ketones such as methyl ethyl ketone, methyl isobutyl ketone, acetylacetone, or isobutyl ketone; alcohols such as methanol, ethanol, n-propanol, i-propanol, n-butanol, i-butanol, or t-butanol; acetates such as ethyl acetate, i-propyl acetate, or polyethylene glycol monomethyl ether acetate; ethers such as tetrahydrofuran or propylene glycol monomethyl ether; or a mixture of two or more thereof.

The organic solvent may be added at the time of mixing the respective components contained in the photopolymer composition, or may be contained in the photopolymer composition while adding the respective components in a state of being dispersed or mixed in an organic solvent. When the content of the organic solvent in the photopolymer composition is too low, the flowability of the photopolymer composition may be lowered, resulting in the occurrence of defects such as the occurrence of striped patterns on the finally produced film. In addition, when too much organic solvent is added, the solid content is lowered, and the coating and film formation are not sufficient, so that the physical properties and surface characteristics of the film may be deteriorated and defects may occur during the drying and curing process. Thus, the photopolymer composition may include an organic solvent such that the total solid content concentration of the components contained is 1% to 70% by weight, or 2% to 50% by weight.

The photopolymer composition may further include other additives, catalysts, and the like. For example, the photopolymer composition may include a catalyst which is commonly known for promoting polymerization of the polymer matrix or photoreactive monomer. Examples of the catalyst include tin octanoate, zinc octanoate, dibutyltin dilaurate, dimethylbis[(1-oxoneodecyl)oxy]stannane, dimethyl tin dicarboxylate, zirconium bis(ethylhexanoate), zirconium acetylacetonate, p-toluenesulfonic acid or tertiary amines such as 1,4-diazabicyclo[2.2.2]octane, diazabicyclononane, diazabicyclo undecane, 1,1,3,3-tetramethylguanidine, 1,3,4,6,7,8-hexahydro-1-methyl-2H-pyrimido(1,2-a)pyrimidine, and the like. Examples of the other additives include a defoaming agent or a phosphate-based plasticizer. As the defoaming agent, a silicone-based reactive additive may be used, and an example thereof is Tego Rad 2500. Examples of the plasticizer include phosphate compounds such as tributyl phosphate. The plasticizer may be added together with the fluorine-based compound at a weight ratio of 1:5 to 5:1. The plasticizer may have a refractive index of less than 1.5 and a molecular weight of 700 or less.

The photopolymer composition can be used for hologram recording.

Meanwhile, according to another embodiment of the present invention, a hologram recording medium produced from the photopolymer composition can be provided.

As described above, when the photopolymer composition of one embodiment is used, it is possible to provide holograms capable of achieving a significantly improved refractive index modulation value and a high diffraction efficiency while having a thinner thickness, as compared with holograms previously known in the art.

The hologram recording medium can realize a refractive index modulation value of 0.015 or more, 0.020 or more, 0.015 to 0.050, 0.015 to 0.040, or 0.020 to 0.030 even at a thickness of 5 μm to 30 μm.

Further, the hologram recording medium may have a variation value of diffraction efficiency according to the following Equation 4 of 18% or less, 17% or less, 16% or less, 0.01% to 18%, 0.01% to 17%, or 0.01% to 16%.

Equation 4

Variation value of diffraction efficiency ($\Delta\eta$)=[Diffraction efficiency ($\eta$) of a sample stored in a dark room under the constant temperature and humidity conditions of 20 to 25° C. and 40 to 50% RH before recording—Diffraction efficiency ($\eta'$) of a sample stored for 24 hours or more in a dark room under the constant temperature and humidity conditions of 40° C. and 90% RH before recording]/Diffraction efficiency ($\eta$) of a sample stored in a dark room under the constant temperature and humidity conditions of 20 to 25° C. and 40 to 50% RH before recording*100

Further, the hologram recording medium can realize diffraction efficiency of 50% or more, or 85% or more at a thickness of 5 μm to 30 μm.

In the photopolymer composition of the one embodiment, the respective components contained therein are homogeneously mixed, dried and cured at a temperature of 20° C. or higher, and then predetermined exposure procedures are undertaken, thereby producing a hologram recording medium for optical application in the entire visible range and the near ultraviolet region (300 to 800 nm).

In the photopolymer composition of the one embodiment, the components of forming a polymer matrix or the precursor thereof are first homogeneously mixed. Subsequently, the linear silane crosslinking agent is mixed with the catalyst to prepare holograms.

In the photopolymer composition of one embodiment, a mixing device, a stirrer, a mixer, or the like which are commonly known in the art can be used for mixing the respective components contained therein without particular limitation. The temperature in the mixing process can be 0° C. to 100° C., preferably 10° C. to 80° C., and particularly preferably 20° C. to 60° C.

Meanwhile, the components of forming the polymer matrix or the precursor thereof in the photopolymer composition of one embodiment are first homogenized and mixed. Subsequently, at the time of adding the linear silane crosslinking agent, the photopolymer composition can be a liquid formulation that is cured at a temperature of 20° C. or more.

The curing temperature may vary depending on the composition of the photopolymer, and the curing is promoted, for example, by heating at a temperature of from 30° C. to 180° C.

At the time of curing, the photopolymer may be in state of being injected into or coated onto a predetermined substrate or mold.

Meanwhile, as the method of recording a visual hologram on a hologram recording medium produced from the photopolymer composition, generally known methods can be used without particular limitation. The method described in the holographic recording method of the embodiment to be described later can be adopted as one example.

Meanwhile, according to another embodiment of the invention, a holographic recording method which includes selectively polymerizing photoreactive monomers contained in the photopolymer composition by a coherent laser may be provided.

Coherent light refers to light that has a constant phase difference and can cause interference. Light from two points on the surface can interfere with objects in the optical machine due to the method of irradiation of the object. If one light wave overlaps another light wave and shows interference in a narrow sense, it is said that the two light waves interfere with each other. In order for light to interfere, the optical frequencies of the two waves must be the same as those of the same light source, so the optical path difference between the two waves must be very large. A complete monochromatic light is an interference light. There are lasers and holography that generate and use coherent lights.

As described above, through the process of mixing and curing the photopolymer composition, it is possible to produce a medium in a form in which no visual hologram is recorded, and a visual hologram can be recorded on the medium through a predetermined exposure process.

A visual hologram can be recorded on the media provided through the process of mixing and curing the photopolymer composition, using known devices and methods under commonly known conditions.

According to another embodiment of the invention, an optical element including a hologram recording medium can be provided.

Specific examples of the optical element include optical lenses, mirrors, deflecting mirrors, filters, diffusing screens, diffraction elements, light guides, waveguides, holographic optical elements having projection screen and/or mask functions, media of optical memory systems and light diffusion plates, optical wavelength multiplexers, reflection-type and transmission-type color filters, and the like.

An example of an optical element including the hologram recording medium may include a hologram display device.

The hologram display device includes a light source unit, an input unit, an optical system, and a display unit. The light source unit is a portion that irradiates a laser beam used for providing, recording, and reproducing three-dimensional image information of an object in the input unit and the display unit. Further, the input unit is a portion that previously inputs three-dimensional image information of an object to be recorded on the display unit, and for example, three-dimensional information of an object such as the intensity and phase of light for each space can be inputted into an electrically addressed liquid crystal SLM, wherein an input beam may be used. The optical system may include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

The display unit can receive three-dimensional image information of an object from an input unit, record it on a hologram plate including an optically addressed SLM, and reproduce the three-dimensional image of the object. In this case, the three-dimensional image information of the object can be recorded via interference of the input beam and the reference beam. The three-dimensional image information of the object recorded on the hologram plate can be reproduced into a three-dimensional image by the diffraction pattern generated by the reading beam. The erasing beam can be used to quickly remove the formed diffraction pattern. On the other hand, the hologram plate can be moved between a position at which a three-dimensional image is inputted and a position at which a three-dimensional image is reproduced.

Advantageous Effects

According to the present invention, a photopolymer composition which can more easily provide a photopolymer layer having improved durability against temperature and humidity while having a large refractive index modulation value, a hologram recording medium using the same, an optical element using the hologram recording medium, and a holographic recording method can be provided.

DETAILED DESCRIPTION OF THE EMBODIMENTS

Hereinafter, the present invention will be described in more detail by way of the following examples. However, these examples are given for illustrative purposes only and are not intended to limit the scope of the present invention thereto.

Preparation Example 1: Preparation Method of Silane Polymer 154 g of butyl acrylate and 46 g of KBM-503 (3-methacryloxypropyltrimethoxysilane) were added to a 2 L jacket reactor and diluted with 800 g of ethyl acetate. The reaction temperature was set at 60 to 70° C., and stirring was carried out for about 30 minutes to 1 hour. 0.02 g of n-dodecyl mercaptan was further added, and stirring was further carried out for about 30 minutes. Subsequently, 0.06 g of AIBN as a polymerization initiator was added and the polymerization was carried out at the reaction temperature for 4 hours or more and maintained until the residual acrylate content became less than 1%, thereby preparing a silane polymer (weight average molecular weight Mw=500,000 to 600,000 g/mol, —Si(OR)$_3$ equivalent weight=1019 g/eq).

Preparation Example 2: Preparation Method of Silane Polymer 180 g of butyl acrylate and 120 g of KBM-503 (3-methacryloxypropyltrimethoxysilane) were added to a 2 L jacket reactor and diluted with 700 g of ethyl acetate. The reaction temperature was set at 60 to 70° C., and stirring was carried out for about 30 minutes to 1 hour. 0.03 g of n-dodecyl mercaptan was further added, and stirring was further carried out for about 30 minutes. Subsequently, 0.09 g of AIBN as a polymerization initiator was added and the polymerization was carried out at the reaction temperature for 4 hours or more and maintained until the residual acrylate content became less than 1%, thereby preparing a silane polymer (weight average molecular weight Mw=500,000 to 600,000 g/mol, —Si(OR)$_3$ equivalent weight=586 g/eq).

Preparation Example 3: Preparation Method of Silane Polymer 255 g of butyl acrylate and 45 g of KBM-503 (3-methacryloxypropyltrimethoxysilane) were added to a 2 L jacket reactor and diluted with 700 g of ethyl acetate. The reaction temperature was set at 60 to 70° C., and stirring was carried out for about 30 minutes to 1 hour. 0.03 g of n-dodecyl mercaptan was further added, and stirring was further carried out for about 30 minutes. Subsequently, 0.09 g of AIBN as a polymerization initiator was added and the polymerization was carried out at the reaction temperature for 4 hours or more and maintained until the residual acrylate content became less than 1%, thereby preparing a silane polymer (weight average molecular weight Mw=500,000 to 600,000 g/mol, —Si(OR)$_3$ equivalent weight=1562 g/eq).

Preparation Example 4: Preparation Method of Linear Silane Polymer

In a 1000 ml flask, 19.79 g of KBE-9007 (3-isocyanatopropyltriethoxysilane), 12.80 g of PEG-400, and 0.57 g of DBTDL were added and diluted with 300 g of tetrahydrofuran. The mixture was stirred at room temperature until it was confirmed by TLC that all the reactants were consumed, and then the reaction solvent was completely removed under reduced pressure. Column chromatography was performed under a developing liquid condition of dichloromethane: methyl alcohol=30:1 to obtain 28 g of a liquid product having purity of 95% or more in a yield of 91% (weight average molecular weight Mw=900 g/mol, —Si(OR)$_3$ equivalent weight=447 g/eq).

Preparation Example 5: Preparation Method of Linear Silane Polymer

In a 1000 ml flask, 12.37 g of KBE-9007 (3-isocyanatopropyltriethoxysilane), 20 g of PEG-1000, and 0.38 g of DBTDL were added and diluted with 200 g of tetrahydrofuran. The mixture was stirred at room temperature until it was confirmed by TLC that all the reactants were consumed, and then the reaction solvent was completely removed under reduced pressure. Column chromatography was performed under a developing liquid condition of dichloromethane: methyl alcohol=30:1 to obtain 26 g of a liquid product having a purity of 90% or more in a yield of 84% (weight average molecular weight Mw=1500 g/mol, —Si(OR)$_3$ equivalent weight=747 g/eq).

Preparation Example 6: Preparation Method of Non-Reactive Low Refractive Index Material In a 1000 ml flask, 20.51 g of 2,2'-((oxybis(1,1,2,2-tetrafluoroethane-2,1-diyl))bis(oxy))bis(2,2-difluoroethan-1-ol) was added and then dissolved in 500 g of tetrahydrofuran. 4.40 g of sodium hydride (60% dispersion in mineral oil) was carefully added over several times while stirring at 0° C. After stirring at 0° C. for 20 minutes, 12.50 ml of 2-methoxyethoxymethyl chloride was slowly dripped therein. When it was confirmed by $^1$H NMR that all the reactants were consumed, the reaction solvent was completely removed under reduced pressure. The organic layer was collected by extracting with 300 g of dichloromethane three times, and filtered with magnesium sulfate, and then the pressure was reduced to remove all the dichloromethane to obtain 29 g of a liquid product having purity of 95% or more in a yield of 98%.

Comparative Preparation Example 1: Preparation Method of Silane Polymer 180 g of butyl acrylate and 20 g of KBM-503 (3-methacryloxypropyltrimethoxysilane) were added to a 2 L jacket reactor and diluted with 800 g of ethyl acetate. The reaction temperature was set at 60 to 70° C., and stirring was carried out for about 30 minutes to 1 hour. 0.02 g of n-dodecyl mercaptan was further added, and stirring was further carried out for about 30 minutes. Subsequently, 0.06 g of AIBN as a polymerization initiator was added and the polymerization was carried out at the reaction temperature for 4 hours or more and maintained until the residual acrylate content became less than 1%, thereby preparing a silane polymer (weight average molecular weight Mw=500,000 to 600,000 g/mol, —Si(OR)$_3$ equivalent weight=2343 g/eq).

Comparative Preparation Example 2: Preparation Method of Silane Polymer 20 g of butyl acrylate and 180 g of KBM-503 (3-methacryloxypropyltrimethoxysilane) were added to a 2 L jacket reactor and diluted with 800 g of ethyl acetate. The reaction temperature was set at 60 to 70° C., and stirring was carried out for about 30 minutes to 1 hour. 0.02 g of n-dodecyl mercaptan was further added, and stirring was further carried out for about 30 minutes. Subsequently, 0.06 g of AIBN as a polymerization initiator was added and the polymerization was carried out at the reaction temperature for 4 hours or more and maintained until the residual acrylate content became less than 1%, thereby preparing a silane polymer (weight average molecular weight Mw=500,000 to 600,000 g/mol, —Si(OR)$_3$ equivalent weight=260 g/eq).

EXAMPLES AND COMPARATIVE EXAMPLES: PREPARATION OF PHOTOPOLYMER COMPOSITION

As shown in Table 1 or Table 2 below, the silane polymers obtained in Preparation Examples 1 to 3 or Comparative Preparation Examples 1 to 2, a photoreactive monomer (high refractive index acrylate, refractive index 1.600, HR 6022 [Miwon]), the non-reactive low refractive index material of Preparation Example 6, tributyl phosphate ([TBP], molecular weight 266.31, refractive index 1.424, manufactured by Sigma-Aldrich), Safranin 0 (dye, manufactured by Sigma-Aldrich), Ebecryl P-115 (SK Entis), Borate V (Spectra Group), Irgacure 250 (BASF), a silicone-based reactive additive (Tego Rad 2500), and methyl isobutyl ketone (MIBK) was mixed in a state of cutting off the light, and stirred with a paste mixer for about 3 to 10 minutes to obtain a transparent coating solution.

The linear silane crosslinking agents obtained in Preparation Examples 4 to 5 were added to the coating solution, and further stirred for 5 to 10 minutes. Subsequently, 0.02 g of DBTDL as a catalyst was added to the coating solution, stirred for about 1 minute, and then coated in a thickness of 6 μm onto a TAC substrate (80 μm thick) using a Meyer bar and dried at 40° C. for 1 hour. Then, the sample was allowed to stand for 24 hours or more in a dark room under constant temperature and humidity conditions of about 25° C. and 50% RH.

EXPERIMENTAL EXAMPLE: HOLOGRAPHIC RECORDING (1) The photopolymer-coated surfaces prepared in each of the examples and comparative examples were laminated on a slide glass, and fixed so that a laser first passed through the glass surface at the time of recording.

(2) Measurement of Diffraction efficiency (η)

A holographic recording was done via interference of two interference lights (reference light and object light), and the transmission-type recording was done so that the two beams were incident on the same side of the sample. The diffraction efficiencies are changed according to the incident angle of the two beams, and become non-slanted when the incident angles of the two beams are the same. In the non-slanted recording, the diffraction grating is generated vertically to the film because the incident angles of the two beams are the same on the normal basis.

The recording (2θ=45° was done in a transmission-type non-slanted manner using a laser with a wavelength of 532 nm, and the diffraction efficiency (η) was calculated according to the following Equation 1.

$$\eta = \frac{P_D}{P_D + P_T} \qquad \text{[Equation 1]}$$

In Equation 1, η is diffraction efficiency, $P_D$ is an output amount (mW/cm$^2$) of the diffracted beam of a sample after recording, and $P_T$ is an output amount (mW/cm$^2$) of the transmitted beam of the recorded sample.

(3) Measurement of refractive index modulation value

The lossless dielectric grating of the transmission-type hologram can calculate the refractive index modulation value (Δn) from the following Equation 2.

$$\eta(DE) = \sin^2(\sqrt{v^2}) = \sin^2\left(\frac{\pi \Delta n d}{\lambda \cos\theta}\right) \qquad \text{[Equation 2]}$$

In Equation 2, d is a thickness of the photopolymer layer, Δn is a refractive index modulation value, η(DE) is diffraction efficiency, and λ is a recording wavelength.

(4) Measurement of the loss amount of laser ($I_{loss}$)

The loss amount of the laser ($I_{loss}$) can be calculated from the following Equation 3.

$$I_{loss}=[1-\{(P_D+P_T)/I_O\}]*100 \qquad \text{[Equation 3]}$$

In Equation 3, $P_D$ is an output amount (mW/cm$^2$) of the diffracted beam of the sample after recording, PT is an output amount (mW/cm$^2$) of the transmitted beam of the recorded sample, and $I_O$ is intensity of the recording light.

(5) Measurement of moist heat resistance

The photopolymer-coated surface prepared in each of the examples and comparative examples was allowed to stand for 24 hours or more in a dark room under constant temperature and humidity conditions of 40° C. and 90% RH, and then the diffraction efficiency (η') was measured in the same manner as in Experimental Example 2. (The sample was kept in a state in which the protective film was removed). Then, the moist heat resistance (Δn) was determined through the variation value of diffraction efficiency according to the following Equation 4.

Equation 4

Variation value of diffraction efficiency (Δη)=[Diffraction efficiency (η) of a sample stored in a dark room under the constant temperature and humidity conditions of 20 to 25° C. and 40 to 50% RH before recording—Diffraction efficiency (η') of a sample stored for 24 hours or more in a dark room under the constant temperature and humidity conditions of 40° C. and 90% RH before recording]/Diffraction efficiency (η) of a sample stored in a dark room under the constant temperature and humidity conditions of 20 to 25° C. and 40 to 50% RH before recording*100

TABLE 1

Measurement Results of Experimental Examples of Photopolymer Compositions of Examples and Holographic Recording Medium Prepared Therefrom

| | Category | Example 1 | Example 2 | Example 3 | Example 4 | Example 5 |
|---|---|---|---|---|---|---|
| Compound used | Preparation Example 1 (unit: g) | 23.1 | 23.1 | — | — | 19.6 |
| | Preparation Example 2 (unit: g) | — | — | 19.3 | — | — |
| | Preparation Example 3 (unit: g) | — | — | — | 25.4 | — |
| | Preparation Example 4 (unit: g) | 8.4 | 8.4 | 12.3 | 6.1 | — |
| | Preparation Example 5 (unit: g) | — | — | — | — | 12.0 |
| | Preparation Example 6 (unit: g) | 34.4 | 17.2 | 17.2 | 17.2 | 17.2 |
| | TBP (unit: g) | — | 17.2 | 17.2 | 17.2 | 17.2 |
| | HR6022 (unit: g) | 31.5 | 31.5 | 31.5 | 31.5 | 31.5 |
| | Safranine O (unit: g) | 0.1 | 0.1 | 0.1 | 0.1 | 0.1 |
| | Ebecryl P-115 (unit: g) | 1.7 | 1.7 | 1.7 | 1.7 | 1.7 |
| | Borate V (unit: g) | 0.3 | 0.3 | 0.3 | 0.3 | 0.3 |
| | Irgacure 250 (unit: g) | 0.1 | 0.1 | 0.1 | 0.1 | 0.1 |
| | Tego Rad 2500 (unit: g) | 0.3 | 0.3 | 0.3 | 0.3 | 0.3 |
| | MIBK (unit: g) | 300 | 300 | 300 | 300 | 300 |
| | Coating thickness (unit: μm) | 6 | 6 | 6 | 6 | 6 |
| | $I_{loss}$ (%) | 25 | 19 | 21 | 20 | 24 |
| | Δn | 0.023 | 0.027 | 0.030 | 0.022 | 0.020 |
| | Δη (%) | Less than 5 | Less than 5 | Less than 5 | 10 | 15 |

TABLE 2

Measurement Results of Experimental Examples of Photopolymer Compositions of Comparative Examples and Holographic Recording Medium Prepared Therefrom

| | Category | Comparative Example 1 | Comparative Example 2 | Comparative Example 3 | Comparative Example 4 |
|---|---|---|---|---|---|
| Compound used | Comparative Preparation Example 1 (unit: g) | 27.2 | — | — | — |
| | Comparative Preparation Example 2 (unit: g) | — | 13.0 | — | — |
| | Urethane polymer (unit: g) | — | — | 27.6 | 27.6 |
| | Preparation Example 4 (unit: g) | 4.3 | 18.6 | — | — |
| | Preparation Example 5 (unit: g) | 17.2 | 17.2 | 30 | 15 |
| | TBP (unit: g) | 17.2 | 17.2 | — | 15 |
| | HR6022 (unit: g) | 31.5 | 31.5 | 40.2 | 40.2 |
| | Safranine O (unit: g) | 0.1 | 0.1 | 0.1 | 0.1 |
| | Ebecryl P-115 (unit: g) | 1.7 | 1.7 | 1.5 | 1.5 |

TABLE 2-continued

Measurement Results of Experimental Examples of Photopolymer
Compositions of Comparative Examples and
Holographic Recording Medium Prepared Therefrom

| Category | Comparative Example 1 | Comparative Example 2 | Comparative Example 3 | Comparative Example 4 |
|---|---|---|---|---|
| Borate V (unit: g) | 0.3 | 0.3 | 0.26 | 0.26 |
| Irgacure 250 (unit: g) | 0.1 | 0.1 | 0.1 | 0.1 |
| Tego Rad 2500 (unit: g) | 0.3 | 0.3 | 0.22 | 0.22 |
| MIBK (unit: g) | 300 | 300 | 300 | 300 |
| Coating thickness (unit: μm) | 6 | 6 | 6 | 6 |
| $I_{loss}$ (%) | 19 | 20 | 15 | 18 |
| Δn | 0.011 | 0.006 | 0.013 | 0.023 |
| Δη (%) | 20 | Less than 5 | 30 | 40-50 |

As shown in Tables 1 and 2 above, it was confirmed that the photopolymer compositions of the examples using the polymer matrix in which the degree of crosslinking was increased by using the linear silane crosslinking agent prepared in Preparation Examples 4 to 5 together with the polymers prepared in Preparation Examples 1 to 3 can provide a hologram in which the variation rate of the diffraction efficiency is as low as 15% or less even under the moist heat-resistant condition together with the refractive index modulation value (Δn) of 0.020 to 0.030 as compared with the comparative examples, while the loss amount of laser is equal to that of the comparative examples.

In particular, it was confirmed that, as the polymers prepared in Preparation Examples 1 to 3 satisfy the range of the equivalent weight of silane functional group from 300 g/eq to 2000 g/eq, the holographic recording medium using the photopolymer compositions of Examples 1 to 5, in which the polymer prepared in Preparation Examples 1 to 3 was used, exhibit remarkably improved refractive index modulation values and moist heat resistance characteristics, as compared with Comparative Examples 1 and 2 using the polymer obtained in Comparative Preparation Examples 1 and 2 in which the equivalent weight of the silane functional group deviates from the range of 300 g/eq to 2000 g/eq.

The invention claimed is:

1. A photopolymer composition comprising:
   a polymer matrix or a precursor thereof including a reaction product between (i) a (meth)acrylate-based (co)polymer in which a silane-based functional group is located in a branched chain and an equivalent weight of the silane-based functional group is 300 g/eq to 2000 g/eq, and (ii) a linear silane crosslinking agent;
   a photoreactive monomer; and
   a photoinitiator;
   wherein the linear silane crosslinking agent includes a linear polyether main chain having a weight average molecular weight of 100 g/mol to 2000 g/mol and a silane-based functional group bonded to a terminal or branched chain of the linear polyether main chain.

2. The photopolymer composition of claim 1, wherein the linear silane crosslinking agent is contained in an amount of 10 parts by weight to 90 parts by weight, based on 100 parts by weight of the (meth)acrylate-based (co)copolymer.

3. The photopolymer composition of claim 1, wherein a modulus (storage modulus) of the reaction product is 0.01 MPa to 5 MPa as measured at a frequency of 1 Hz at room temperature using DHR equipment (TA Instruments).

4. The photopolymer composition of claim 1, wherein the silane-based functional group and the linear polyether main chain are bonded via a urethane bond.

5. The photopolymer composition of claim 1, wherein an equivalent weight of the silane-based functional group contained in the linear silane crosslinking agent is 200 g/eq to 1000 g/eq.

6. The photopolymer composition of claim 1, wherein a ratio between the equivalent weight of the silane-based functional group located in the branched chain of the (meth)acrylate-based (co)polymer and the equivalent weight of the silane-based functional groups contained in the linear silane crosslinking agent is from 22:1 to 0.5:1.

7. The photopolymer composition of claim 1, wherein the photoreactive monomer comprises a polyfunctional (meth)acrylate monomer or a monofunctional (meth)acrylate monomer.

8. The photopolymer composition of claim 1, wherein the photoreactive monomer has a refractive index of 1.5 or more.

9. The photopolymer composition of claim 1, wherein the photopolymer composition comprises: 20% to 80% by weight of the polymer matrix or a precursor thereof; 10% to 70% by weight of the photoreactive monomer; and 0.1% to 15% by weight of the photoinitiator based on the total weight of the photopolymer composition.

10. The photopolymer composition of claim 1, wherein the photopolymer composition further comprises a fluorine-based compound.

11. The photopolymer composition of claim 10, wherein the fluorine-based compound includes at least two difluoromethylene groups, and at least one functional group selected from the group of an ether group, an ester group, and an amide group.

12. The photopolymer composition of claim 10, wherein the fluorine-based compound has a refractive index of less than 1.45.

13. The photopolymer composition of claim 10, wherein the fluorine-based compound is contained in an amount of 30 parts by weight to 150 parts by weight, based on 100 parts by weight of the photoreactive monomer.

14. The photopolymer composition of claim 1, wherein the polymer matrix has a refractive index of 1.46 to 1.53.

15. The photopolymer composition of claim 1, wherein the photopolymer composition further comprises a photosensitizing dye, or other additives.

16. A hologram recording medium produced by curing the photopolymer composition of claim 1.

17. An optical element comprising the hologram recording medium of claim 16.

18. A holographic recording method comprising selectively polymerizing photoreactive monomers contained in the photopolymer composition of claim 1 by a coherent laser.

* * * * *